(12) United States Patent
Koslar et al.

(10) Patent No.: US 6,466,609 B2
(45) Date of Patent: *Oct. 15, 2002

(54) METHOD FOR WIRELESS INFORMATION TRANSFER

(75) Inventors: Manfred Koslar; Zbigniew Ianelli, both of Berlin (DE)

(73) Assignee: Nanotron Gesellschaft fur Mikrotechnik mbH (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/297,182

(22) PCT Filed: Nov. 3, 1997

(86) PCT No.: PCT/DE97/02606

§ 371 (c)(1),
(2), (4) Date: Apr. 26, 1999

(87) PCT Pub. No.: WO98/20625

PCT Pub. Date: May 14, 1998

(65) Prior Publication Data

US 2001/0043656 A1 Nov. 22, 2001

(30) Foreign Application Priority Data

Nov. 1, 1996 (DE) .......................... 196 46 747

(51) Int. Cl.[7] .......................... H04B 15/00; H04K 1/00; H04L 27/30
(52) U.S. Cl. .......................... 375/139; 359/154
(58) Field of Search .......................... 375/139; 359/154

(56) References Cited

U.S. PATENT DOCUMENTS 3,969,725 A    7/1976  Couvillon et al.
5,105,294 A *  4/1992  Degura et al. ............. 359/154
5,381,798 A    1/1995  Burrows

FOREIGN PATENT DOCUMENTS

DE    36 18 416       3/1987
DE    39 28 571       3/1990
DE    32 16 666       11/1992
DE    196 01 866      8/1996
EP    223 554         5/1987
WO    WO/96/18913     6/1996

OTHER PUBLICATIONS

Couch II, Leon W, *Digital and Analog Communication Systems*, Macmillan Publishing Co., NY, NY, 4th. ed. 1993.
Utlaut, W.F., "Spread–spectrum principles and possible application to spectrum utilization and allication", *telecommunication journal*, vol. 43, 1978, pp. 20–32.
E. Philippow (publisher), , Systeme der Informationstechnik, Berlin 1985, *Taschenbuch der Elektrotechnik*, vol. 4, , p. 340–41.

* cited by examiner

*Primary Examiner*—Phuong Phu
(74) *Attorney, Agent, or Firm*—Merchant & Gould P.C.

(57) ABSTRACT

Method for wireless information transfer, in particular for mobile communications, in which an input signal ($s_1$, $g_4$) is subjected to a modulation in a transmitter (2 to 8) and reaches a receiver (11 to 15) through a transmission channel, whereby angle modulated pulses, carrying information and possessing a frequency spectrum, are generated in the transmitter in such a way that they can be time compressed in a receiver by means of a filter (13) with frequency dependent, differential delay time, also known as group delay, in such a way, that pulses arise with shortened duration and increased amplitude compared to the emitted pulses, and at least a portion of the information is imprinted onto the pulses using an additional modulation, independent of the angle modulation, arid/or is used for controlling a parameter of the angle modulation that can then be registered in the receiver.

15 Claims, 11 Drawing Sheets

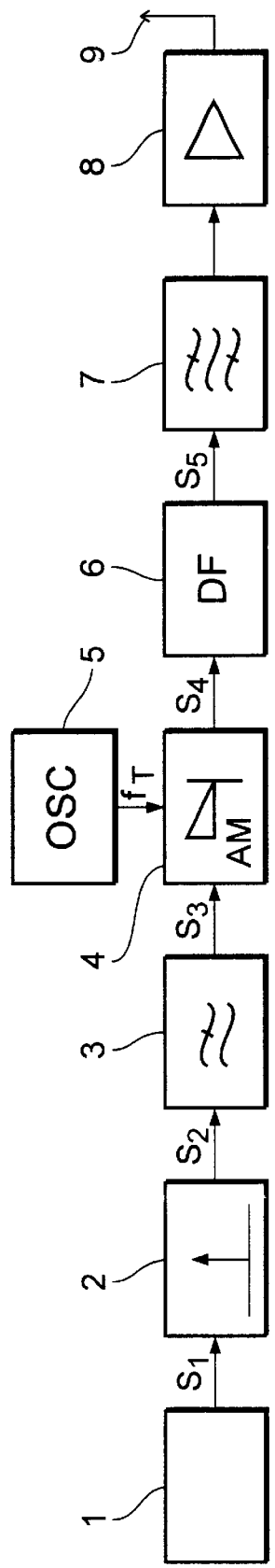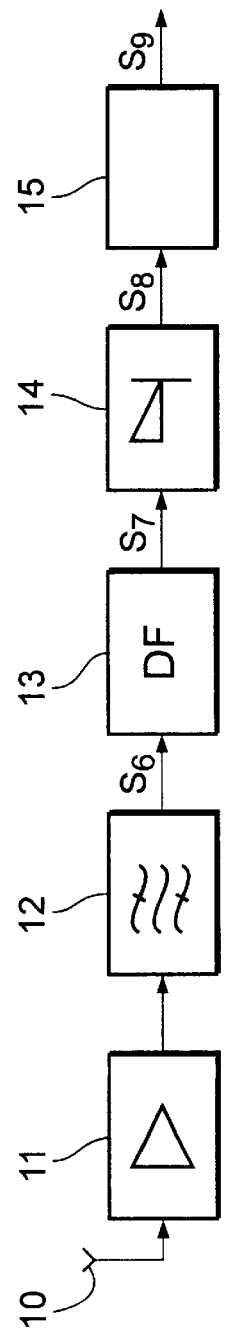
Fig.1a
Fig.1b

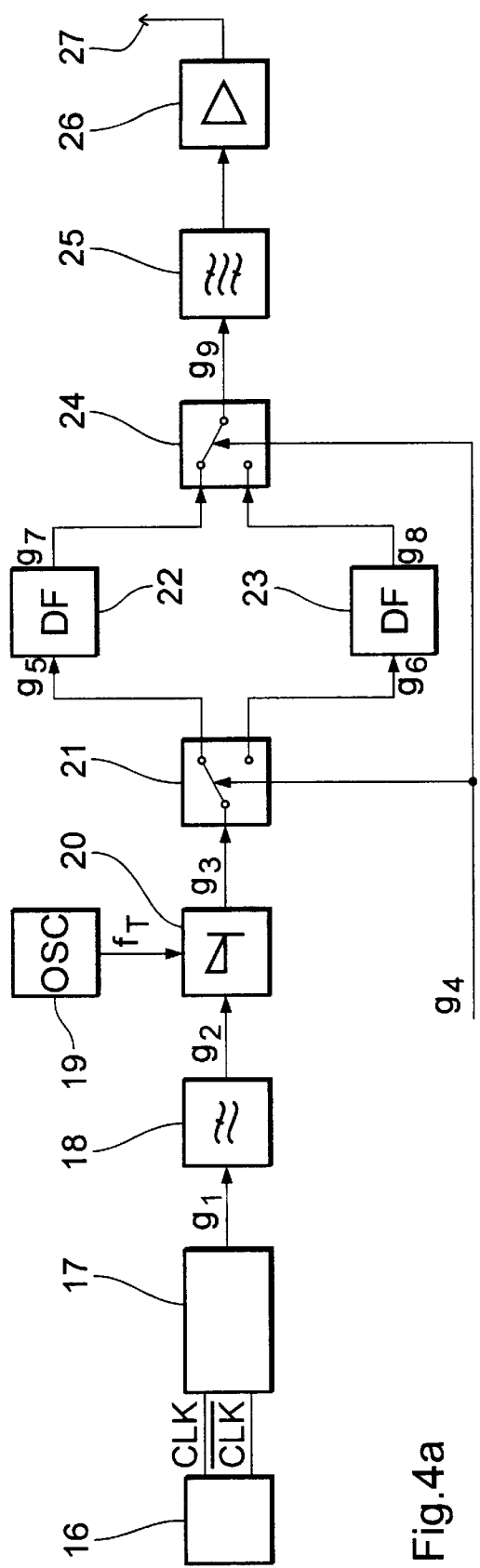
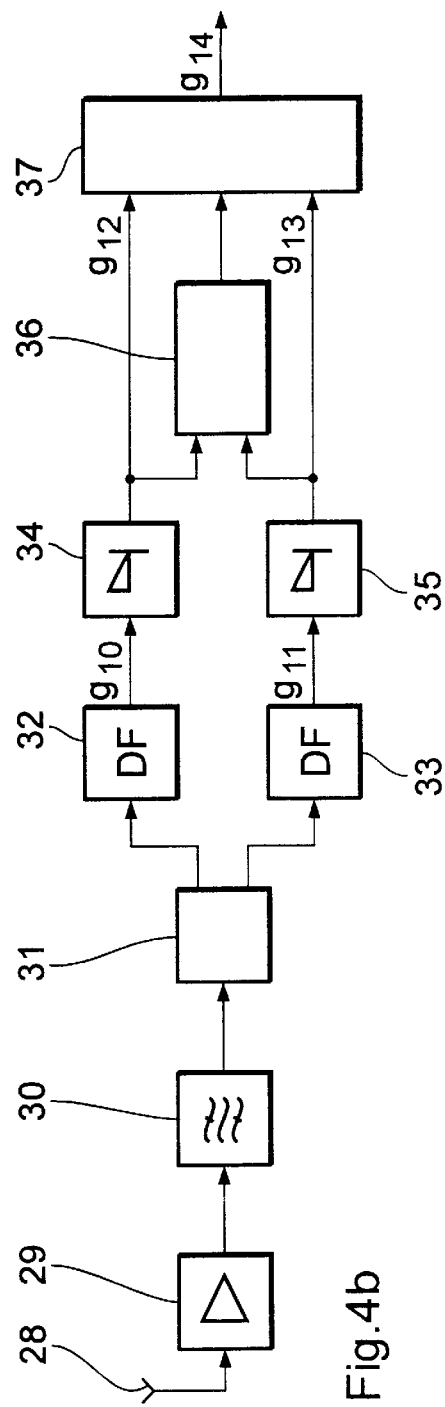
Fig.4a
Fig.4b

METHOD FOR WIRELESS INFORMATION TRANSFER

BACKGROUND OF THE INVENTION

The invention relates to a method as in claim 1, as well as to a transmitter and receiver arrangement for implementation of the method as in claim 12.

In wireless information transfer methods, that are well known to the expert from standard reference works, the information signal to be transmitted is modulated upon a high frequency carrier signal in the transmitter and transferred over a transmission path to the receiver, which contains a corresponding demodulator for the recovery of the information signal. A well known modulation method in telecommunications is the angle modulation (as generic term for frequency and phase modulation).

If the information signal to be transmitted is present in digital form as a bit sequence, as is the case in modern mobile radio networks, then the modulation is carried out by variation of the frequency, or phase, or amplitude of the carrier signal, depending on the bit sequence to be transmitted. Various digital modulation methods are known, for example from COUCH, L. W.: Digital and Analog Communication Systems, $4^{th}$ Edition, Macmillan Publishing Company (1993), among them amplitude-shift keying (ASK: Amplitude Shift Keying), two phase-shift keying (2-PSK: Phase Shift Keying) or two frequency-shift keying (2-FSK: Frequency Shift Keying). Here too a demodulation is carried out in the receiver according to the modulation method employed on the transmitter side, thus effecting a recovery of the digital information signal as a bit sequence in form of consecutive pulses.

The use of several different modulation methods for different messages, or message components, as part of a continuous transmission process is known to the expert, for example from analogue television engineering, where the vestigial side-band amplitude modulation is used for the luminance signal, the frequency modulation for the audio signal, and the IQ modulation for the chrominance signal. Here too, the variation of the carrier parameter s serves only in the imprinting of the information and has no effect on noise of the transmission path.

A method for expansion of emitted tracking pulses on the transmitter side and compression on the receiver side is known from radar technology ("Chirp"-technique); compare E. Philippow (Publisher.): Taschenbuch der Elektrotechnik, Vol. 4, Systeme der Informationstechnik, Berlin 1985, p. 340,341. Hereby an analogue frequency modulation or a digital phase modulation is applied in the compression, but no imprinting of information takes place. This method serves in the reduction of the expended transmission power, and thus a potential opponent's ability to detect the signals, while simultaneously maintaining range and accuracy of coverage.

A basic physical problem exists in all communication methods: the quality of the information signal that is recovered on the receiver side decreases with the amount of interference on the transmission path (always present in reality), and thus with the distance between transmitter and receiver. To obtain a desired working distance at a predetermined noise immunity in a communication over a noisy transmission path, a certain transmission power is necessary, which, for example for mobile communications, is in the range of Watts.

On one hand, the required transmitting power has the disadvantage that the energy consumption during the transmitting operation is correspondingly high, which in particular for battery or accumulator battery operated devices, such as mobile telephones, is a problem, due to the rapid depletion of the energy store. On the other hand, the rising, number of communication transmitters caused by the explosive distribution of mobile telephones, the increasing number of providers of radio broadcasts and television programs etc, increases the total impact of electromagnetic radiation on humans (so called "human exposure"). Harm to the human body can not be ruled out, in particular for mobile telephones at the presently customary transmitter power, due to the very low distance of the transmitter to the use's head.

SUMMARY OF THE INVENTION

This invention has the objective to develop a method of the type mentioned at the beginning, and an arrangement for the implementation thereof, which allows a reduction in transmission power and/or and increase in range while maintaining at least equal transmission quality.

This objective is met, starting with a method according to claim 1, by this method's characterizing features, and—regarding the arrangement for implementing the method—by the features of claim 12.

The invention includes the principal thought to use two independent modulation methods to imprint the information onto a carrier (information signal modulation) and to achieve extensive suppression of noise on the transmission path, in particular of the thermal or "white" noise (carrier signal modulation).

The pulses that have been modulated, or are to be modulated, with the information according to a well known method of telecommunications, in the transmitter are subjected to an angle modulation (which here is to be understood as generic term for phase and frequency modulation) with a special characteristic. The angle modulated pulses, showing a predetermined frequency spectrum, are time compressed in the receiver by introducing a frequency dependent delay. Thus an amplitude enhancement results at the receiver output, compared to the amplitude of the transmitted signal, and thus to the noise level. In particular, this pulse compression/amplitude enhancement can be carried out using a dispersive filter. The information signal is recovered from the carrier processed in this manner by demodulation, whereby the demodulation of the information signal occurs with a signal/noise ratio improved by the amplitude enhancement.

The improvement of the signal/noise ratio is dependent on the bandwidth-time-product of the bandwidth used in the angle modulation and the pulse duration, and is especially prominent in poor transmission conditions.

The actual information can be imprinted onto the carrier by pulse modulation techniques, or by carrying out the carrier compression so that it can be evaluated in different ways for different states of the information signal, so that the information is contained in this variation of the angle modulation. Hereby it is important that the modulation of the information has no, or only secondary, influence on the signal delay time.

After the demodulation the available signal is of a quality, which in the state of technology could only be achieved by increased transmitting power or by costly methods for the improvement of reception (such as diversity reception or redundant transmission). A further advantage of this invention's method lies in the essentially lower potential for interference compared to other transmission paths, because a predetermined signal/noise ratio can be achieved after the pulse compression in the receiver using lower transmitting power. In addition, the lower demands on the transmitting power lead to a reduced human exposure. The disadvantage of this method, a higher required bandwidth, and thus a reduced channel capacity or transfer rate (bit rate) can be accepted for many areas of application, and can be partially eliminated through the selection of a matching pulse modulation method for the modulation of the information (see below).

A special angle modulation time characteristic is used in the variable angle modulation, which corresponds to a "modulation characteristic curve". Hereby, the modulation characteristic curve—here referred to as modulation characteristic—determines the time behavior of the frequency during the duration of each pulse. When a linearly falling modulation characteristic is used, the frequency of the transmitted signal decreases linearly, during the duration of each pulse, from a value above the carrier frequency to one lying below the carrier frequency. Analogously, a linearly rising characteristic can be used. The filter on the receiver side is matched to the (employed modulation characteristic by a corresponding differential, frequency dependent delay time response (group delay response) in such a way that the signal components of different phase position, generated on the transmitter side are superimposed to a signal nearly coincident in time (approximate δ-pulse).

In an advantageous embodiment of the invention the imprinting of the information of the input signal occurs by selecting or varying the modulation characteristic depending on the input signal. If the input signal contains a high-level, then, for example, a modulation characteristic decreasing (most simply linearly) with the signal is used, which leads to a frequency modulated pulse with a frequency decreasing during the pulse duration ("Down-Chirp"). In contrast, a (linearly) rising modulation characteristic is used for a low-level of the input signal, which correspondingly yields a pulse with a frequency that rises during the pulse duration ("Up-Chirp").

The filter means on the receiver side are matched by an inverse or complementary characteristic. If the angle modulation on the transmitter side is carried out according to a decreasing modulation characteristic, then the frequency of the pulse decreases during the pulse duration, which has as a result that the signal components of higher frequency arrive on the receiver side before the signal components of lower frequency. Thus, the delay time response of the dispersion filter on the receiver side has to compensate for the "lead" of the high frequency signal components, so that the spectral signal components of the frequency modulated pulse superpose to form a pulse with increased amplitude at the output of the dispersion filter.

To transmit a higher information content with each pulse, it is possible to use more than two modulation characteristics for the input signal. If, for example, four modulation characteristics are available, then accordingly four different pulses can be transmitted, which corresponds to an information content of 2 bit for each transmitted pulse. By increasing the number of different modulation characteristics, the data transfer rate can be advantageously increased, whereby it must be noted that the technical expense increases at the same time, and the different pulses with a very large number of different modulation characteristics become more difficult to distinguish, which increases the transmission's susceptibility to errors.

In the previously described variation of the invention, the modulation of pulses is carried out actively for a high-level as well as for a low-level of the digital input signal. This means that frequency modulated pulses are generated for a high-level as well as for a low-level of the input signal, which can be distinguished by the type of frequency variation during the pulse duration. Hereby, the imprinting of the information contained in the input signal occurs through selection or variation of a modulation characteristic, depending on the input signal.

Alternatively, the transmission of the input signal can be carried out actively for only one of two defined levels, while no pulse is generated for the other level. For example, a linearly rising frequency modulated pulse is generated for a high-level of the input signal, while a pause of the pulse's length is inserted for a low-level. This variation of the invention allows implementing the method using a single modulation characteristic, with low technical expense. In particular, only one dispersion filter is required on the receiver side.

The imprinting of the information contained in the input signal onto the transmitted signal occurs according to a known modulation methods, which are at least approximately orthogonal, for example: a pulse code modulation (PCM), or a differential pulse code modulation (DPCM), or a pulse delta modulation (PDM), preferably using pulse position modulation (PPM), in which the position of the individual frequency modulated pulses is varied relative to a reference pulse, depending on the input signal. Application of the pulse phase- or pulse width modulations is in principle suitable, but potentially requires higher technical expense, or does not match all the advantages of the PPM.

Using the combination of "chirp" modulation, for carrier noise suppression, and PPM, for imprinting the information, lends itself in a particularly advantageous manner for utilizing the increase in time resolution on the receiver side, that arises in the pulse compression of pulses with very short rise time, for increasing the transmission rate (with respect to the increased band width), by utilizing the superposition principle in the reception of pulses overlapping in time. Seen in its entirety, this allows for extensive compensation of the original loss of transmission rate. A (small) portion of the transmitting power saved due to the compression is employed for the emitting of the reference pulses needed for the PPM, and potentially for additional encoding pulses in the same channel.

The recovery of the information that is contained in the input signal is effected by a detector, connected after the dispersion filter, that is matched to the modulation method that is employed for imprinting the information, contained in the input signal, on the transmitter side.

If one of several modulation characteristics is selected on the transmitter side, depending on the amplitude of the input signal, preferably a linearly falling modulation characteristic for a high-level and a linearly rising modulation characteristic for a low-level of the input signal, then two options exist for the interpretation in the receiver.

One option consists of providing only one dispersion filter on the receiver side, the differential phase delay, or group delay response, of which is matched to one of the modulation characteristics used on the transmitter side in such a way, that the signal components of the pulse, frequency modulated according to this modulation characteristic, arrive superposed at the output of the dispersion filter, which leads to a pulse compression and increase in amplitude. For a pulse of one of the other modulation characteristics, that is not optimally matched to the delay time response of the dispersion filter on the receiver side, the spectral signal components arrive spread over time at the output of the dispersion filter, and thus, due to the lower pulse compression, with lower amplitude. Thus, in this embodiment the amplitude of the pulse arriving at the output of the dispersion filter depends on the modulation characteristic employed on the transmitter side, and thus on the amplitude of the input signal that was used in the selection of the modulation characteristic. To recover the digital input signal from the output signal of the dispersion filter, an amplitude sensitive detector, potentially executed as amplitude demodulator, is connected after the dispersion filter.

In the other option the frequency modulated pulse is fed to several dispersion filters, connected in parallel, on the receiver side. The frequency depending delay time response of the dispersion filter on the receiver side and the modulation characteristics used on the transmitter side are matched in pairs, in such a way that the signal components of the frequency modulated pulse arrive compressed at the output of exactly one of the dispersion filters, thus leading to an increase in amplitude, while no increase occurs in the output signals of the other dispersion filters, due to the different characteristic. Thus the input signal can be discriminated according to the particular dispersion filter at which an increase in amplitude is present.

Advantageously, the dispersion filters are executed as surface acoustic wave filters ("SAW filter"), which can be manufactured with high accuracy and stability. In addition, SAW filters offer the advantage that amplitude response and phase response can be dimensioned independently of each other, which offers the possibility to execute the narrow banded band-pass filter required in each receiver and the dispersion filter as one component.

The generation of the frequency modulated signal in the transmitter can occur in different ways, some of which will be briefly described as examples in the following.

In an advantageous variation of the invention, at first an approximate (quasi-) Dirac pulse is generated and fed to a low-pass filter, the filter characteristic of which possesses a peak shortly before the critical frequency, and thus transforms the delta-pulses into Sinc-pulses, the shape of which is described by the well known Sinc-function, Sinc(x)=sin (x)/x. Subsequently, the Sinc-shaped output signal of the low-pass filter is led to an amplitude modulator that imprints the Sinc-shaped envelope onto a carrier oscillation. If the signal generated in this manner is fed to a dispersive filter, then a frequency modulated pulse appears at the output. Thus in this variation of the invention, at first a dispersion filter on the transmitter side expands the relatively sharp Sinc-pulse into a frequency modulated pulse, which is broadened compared to the Sinc-pulse and has a correspondingly lower amplitude. A compression of the pulse, with a corresponding increase in amplitude, subsequently occurs on the receiver side, also using a dispersion filter. Since one dispersion filter each is used for the expansion of the pulses on the transmitter side, and for the compression on the receiver side, this variation of the invention is advantageously suited for a transceiver operation with alternating transmitting and receiving operation. For this purpose, the transmitter and receiver can contain corresponding identical component modules with one dispersion filter each, that in transmitting operation serve in the generation of the frequency modulated pulse, and in receiving operation help in the compression of the received frequency modulated pulse.

In another variation of the invention, the generation of the frequency modulated pulses; is effected using a PLL (PLL: Phase Locked Loop) and a voltage controlled oscillator (VCO: Voltage Controlled Oscillator). The individual pulses of the input signal, that is present in digital form, hereby are at first converted to saw-tooth shaped pulses in an integrator, whereby the rise direction of the individual pulses depends on the amplitude of the input signal. The signal generated in this manner is then used for triggering the VCO, so that the frequency of the output pulse linearly increases or decreases during the pulse duration, depending on the level of the input signal.

In a further variation of the invention, a digital signal-processing unit generates the frequency modulated pulse in the transmitter, which advantageously allows the implementation of any desired modulation characteristics.

In a variation of the invention, matched transmitter-receiver pairs are produced to implement the complementary transmitter-receiver characteristics, so that no further tuning work is required when the system is put in operation.

In another variation of the invention the receiver is matched to the transmitter before or during the operation, by varying the delay time response of the dispersion filter used on the receiver side. Hereby, the transmitter, as part of a matching process, generates a reference signal, which preferably corresponds to a series of high-levels of the input signal, whereby the modulation characteristic of the frequency modulation carried out on the transmitter side, or the frequency dependent delay time response of the dispersion filter on the receiver side, are varied until an optimum pulse compression or increase in amplitude occurs on the receiver side. This variation is especially advantageous when using a digital signal processor for filtering and processing in the receiver, since such a signal processor allows in simple manner a variation of the frequency dependent delay time response and a corresponding optimization, whereby the optimization procedure can be executed automatically, by computer control.

In a further advantageous embodiment of this variation, the data transfer occurs block by block, whereby the above mentioned matching process is carried out renewed for each block, to be able to dynamically compensate for fluctuations of the dispersion characteristics on the transmission path.

Advantageous further developments of the invention are identified in the secondary claims, or will be described, together with the invention's preferred embodiment, in more detail in the following.

BRIEF DESCRIPTION OF THE DRAWINGS

FIGS. 1a, 1b show in a block diagram, as the invention's preferred embodiment example, a transmitter and receiver of a message transfer system.

FIGS. 4a, 4b show in a block diagram the transmitter and receiver of a message transfer system with active transmission of high and low levels.

DESCRIPTION OF THE INVENTION

A transmitter, illustrated in FIG. 1a, serves in the transmission of a signal $s_1$, generated by signal source 1 and present in a form that can be digitized, across a noisy transmission path to the receiver, illustrated in FIG. 1b, whereby, for predetermined requirements on range and noise immunity, the transmission can advantageously be made with relatively low transmitting power, which on one hand increases the battery life for battery operated transmitters, and on the other hand reduces the environmental impact by electromagnetic radiation—also known as Electro-smog. In addition, compared to other communications systems, the error potential of the transmitter is reduced due to the relatively low transmission power.

Figure 2A:
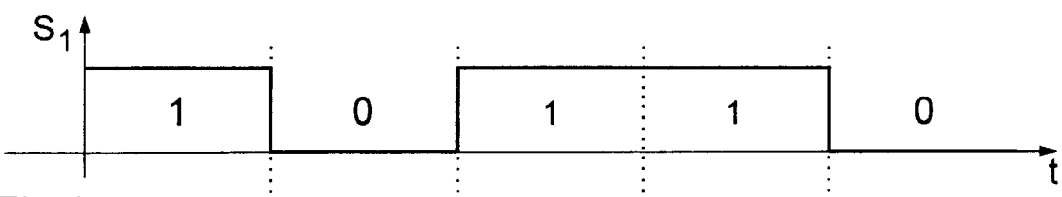
FIGS. 2a to 2e show the digital input signal of the transmitter, as well as several intermediary stages of the signal processing in the transmitter up to the transmission signal.
Figure 2B:
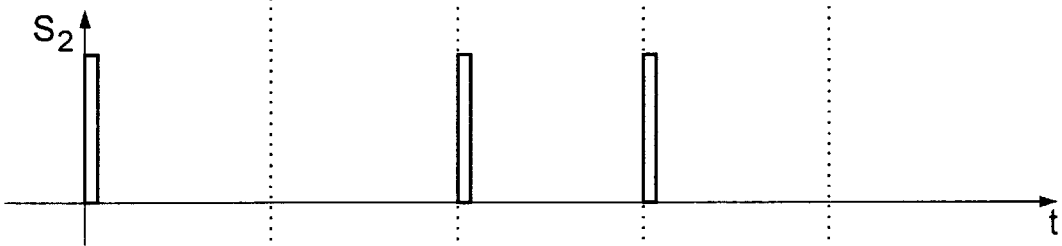

In the transmitter, a digital input signal $s_1$, the time behavior of which is shown in detail in FIG. 2a, is at first fed to a pulse shaper 2, which transforms the relatively wide square pulses of input signal $s_1$ to short needle pulses that are meant to emulate (quasi-) Dirac pulses. It can be seen in the illustration of the needle pulse sequence $s_2$ in FIG. 2b that the generation of the individual needle pulses is triggered every time by the rising edge of the square pulses of input signal $s_1$.

Figure 2C:
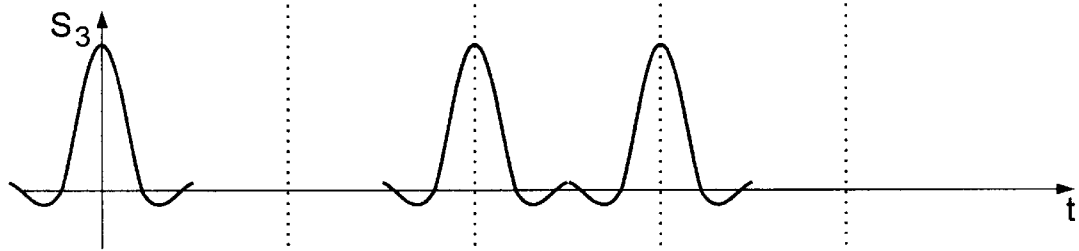

A needle pulse sequence $s_2$ generated in this manner is subsequently fed to a low-pass filter 3, the delay time response of which possesses a peak shortly before the critical frequency, so that the individual needle pulses—as can be seen in FIG. 2c—are transformed to Sinc-pulses, the shape of which conforms to the well known Sinc-function $Sinc(x)=sin(x)/x$.

Figure 2D:
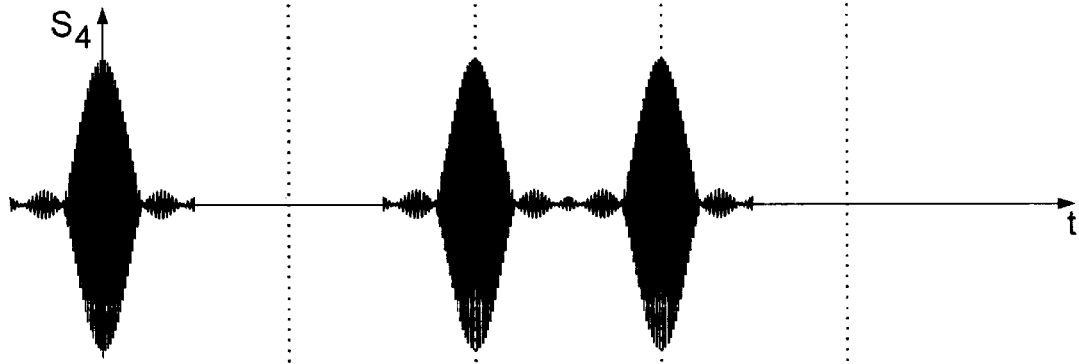

Subsequently the Sinc-pulse series $s_3$ is carried to an amplitude modulator 4, which modulates this signal onto a carrier oscillation of frequency $f_T$, which is generated by oscillator 5, so that carrier frequency pulses with a Sinc-shaped envelope are generated at the output of the amplitude modulator 4, as illustrated in FIG. 2d. (For illustrative purposes the pulses are shown broadened in the drawing, in reality, when shown to scale, they are narrower).

Figure 2E:
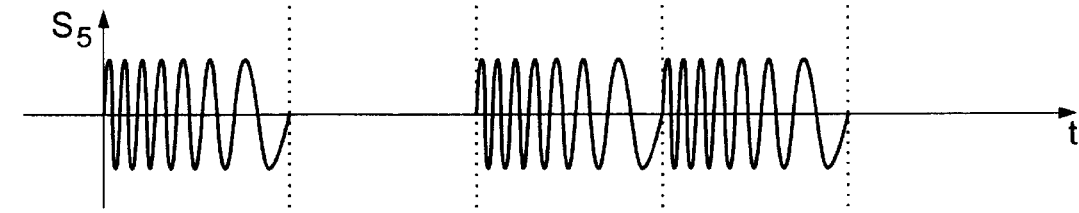

A dispersion filter 6 is connected after the amplitude modulator 4, which filters the modulated carrier frequency signal $s_4$ according to its frequency dependent, differential delay time characteristics. At the output of the dispersion filter 6 arrive—as can be seen in FIG. 2e—linearly frequency modulated pulses with constant amplitude, the frequency of which decreases during, the pulse duration from a value $f_T+\Delta f/2$ above the carrier frequency $f_T$ to a value $f_T-\Delta f/2$ below the carrier frequency.

Thus in the transmitter shown here, the transmission of the input signal $s_1$ is made unipolar, i.e. a transmission pulse is only generated for a high level of the input signal $s_1$, while a low level can be recognized from a pause in the transmission signal $s_5$. For this reason transmitter and receiver can be constructed reasonably simply, each only containing one dispersion filter 6,13.

The pulse sequence $s_5$ generated in this manner is subsequently fed to a band-pass filter 7, the center frequency of which is equal to the carrier frequency $f_T$ of the frequency modulated pulses, so that signals outside the transmission band are filtered out.

Finally, the band-pass limited signal is supplied to antenna 9 by a transmitter amplifier 8 and emitted.

The receiver shown in FIG. 1b allows the reception of the linearly frequency modulated signal, emitted by the transmitter described above, as well as the demodulation and recovery of the digital input signal $s_3$ or $s_1$.

Figure 3A:
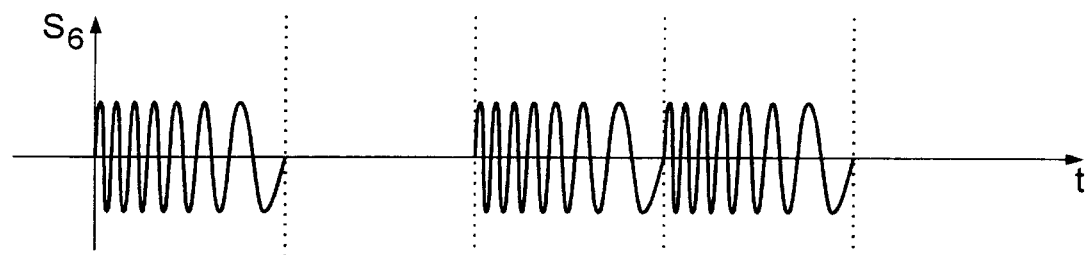
FIGS. 3a 3d show the received signal, as well as several intermediary stages of the signal processing in the receiver, up to the demodulated signal.

For this, the signal received by the receiver's antenna 10—for example in diversity operation—is fed to a pre-amplifier 11 and subsequently a band-pass filter 12, the center frequency of which is equal to the carrier frequency $f_T$ of the band-pass limited transmission signal, so that noise signals from other frequency ranges can be filtered out of the receiver signal. (Instead of a conventional band-pass filter a surface acoustic wave filter can be used here.) The time behavior of the signal $s_6$ prepared in this manner is shown in detail in FIG. 3a, whereby for simplification a noise free transmission path is assumed.

The received signal $s_6$ consists of a series of linearly frequency modulated pulses, whereby the frequency decreases during the pulse duration, according to the modulation characteristic used on the transmitter side, from a value $f_T+\Delta f/2$ above the carrier frequency $f_T$ to a value $f_T-\Delta f/2$ below the carrier frequency.

Subsequently the signal $s_6$ is fed to a dispersion filter 13, which time compresses the individual pulses of the input signal $s_6$, which leads to a corresponding increase in amplitude, and thus an improved signal/noise ratio.

Hereby the pulse Compression utilizes the fact that the signal components of higher frequency arrive at the output of the dispersion filter 13 before the lower frequency signal components, due to the linear frequency modulation carried out on the transmitter side. The dispersion filter 13 compensates for the "lead" of the higher frequency signal components by delaying these Galore than the lower frequency signal components.

Figure 3B:
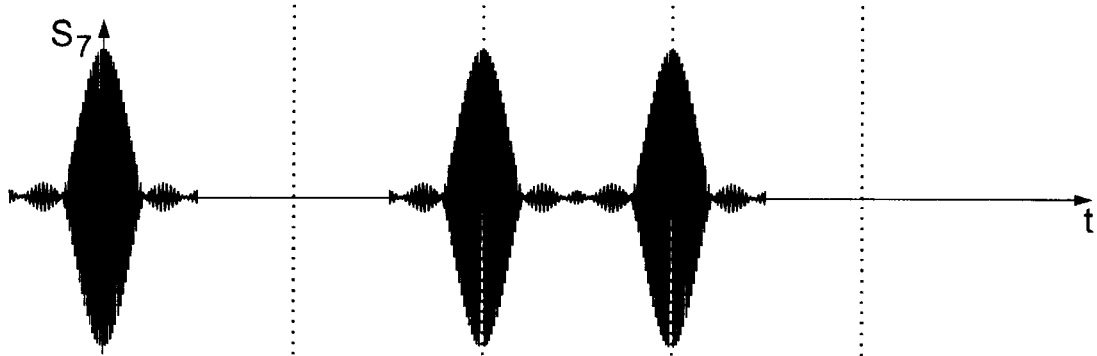

Hereby the frequency dependent, differential delay time response of dispersion filter 13 is matched to the modulation characteristic of the frequency modulation carried out on the transmitter side, in such a manner, that the spectral signal components of the received signal arrive essentially coincident at the output of dispersion filter 13. As seen in FIG. 3b, the spectral components superpose to form a signal $s_7$ with Sinc-shaped envelope for each pulse, whereby the amplitude of the individual pulses is significantly increased compared to the received linear frequency modulated signal $s_6$. (It should be noted at this point that for improved clarity a distortion was introduced in the schematic signal representations shown in the figures. In reality the frequency-modulated pulses are closer together and the compressed signals are much narrower.)

Figure 3C:
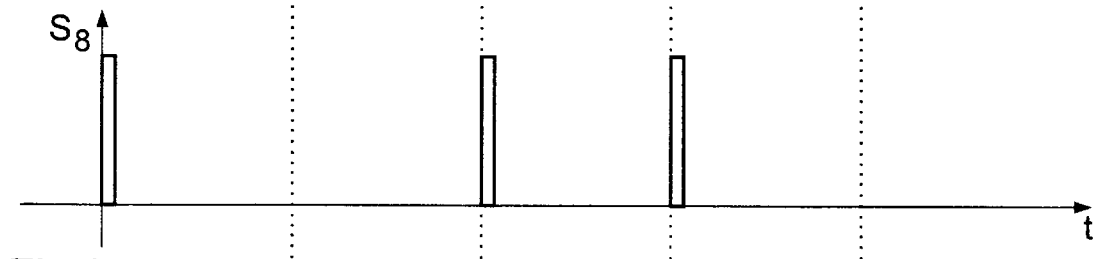

Subsequently the output signal of the dispersion filter 13 is fed to a demodulator 14, which separates signal $s_7$ from the high frequency carrier oscillation and—as seen in FIG. 3c—generates a discrete output signal $s_8$ with needle shaped pulses.

Figure 3D:
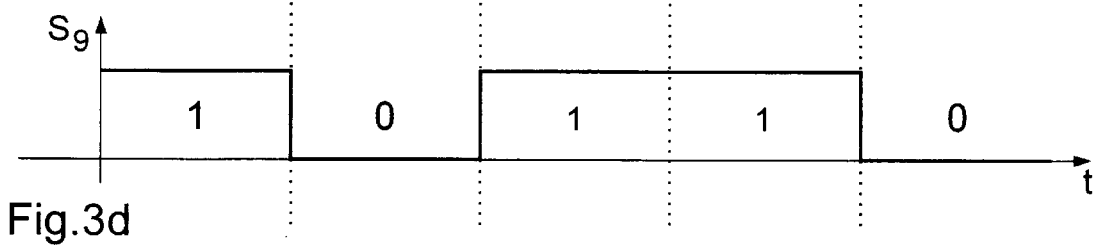

Subsequently, the original digital signal $s_9$, the time behavior of which is shown in detail in FIG. 3d, is recovered from the needle shaped pulses using a pulse shaper 15.

FIGS. 4a and 4b show a further message transfer system according to this invention, which differs from the simpler embodiment example, described above and illustrated in FIGS. 1a and 1b, most importantly by the fact that both the high level as well as the low level of the digital information signal are transmitted actively, which contributes to a higher noise immunity.

Figure 5A:
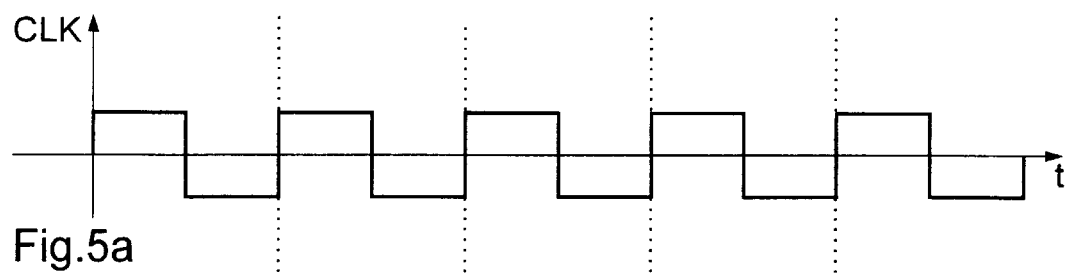
FIGS. 5a to 5k show the digital input signal of the transmitter of FIG. 4a, as well as several intermediary stages of the signal processing in the transmitter.
Figure 5B:
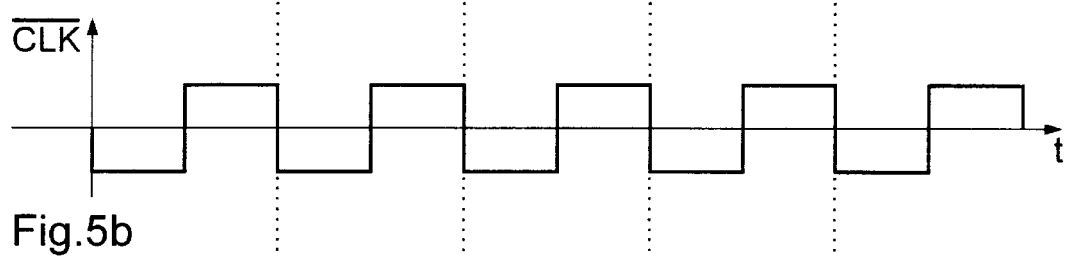
Figure 5C:
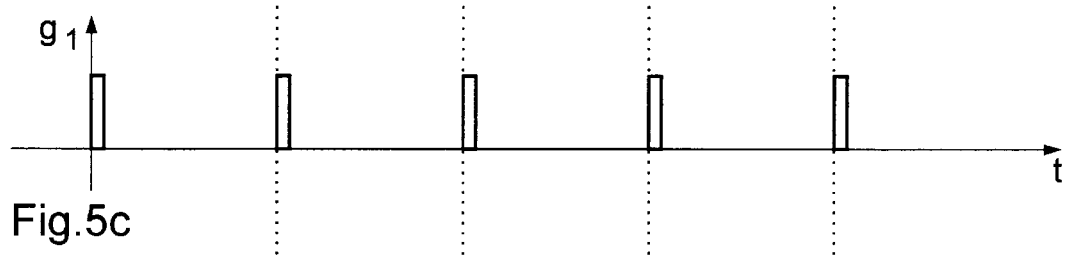
Figure 5D:
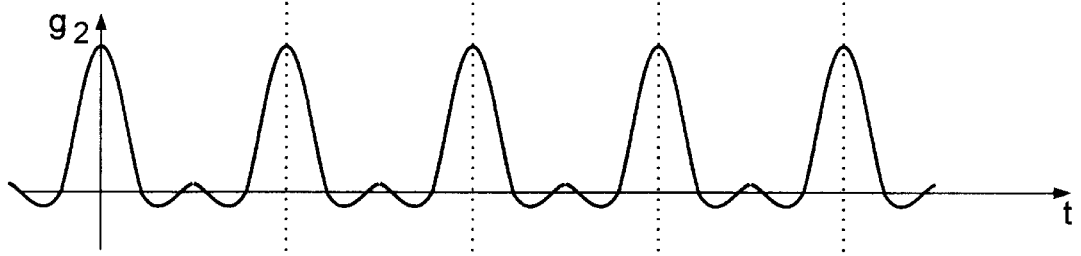
Figure 5E:
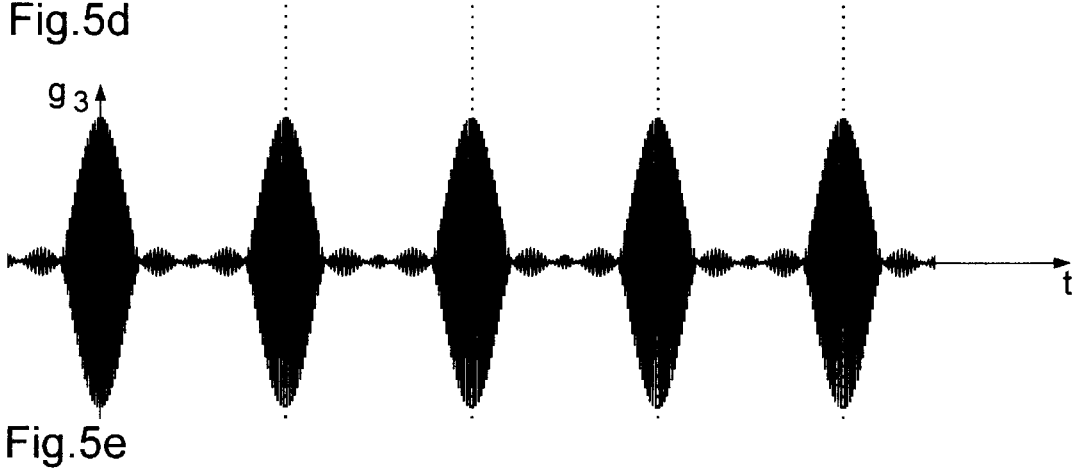
Figure 5F:
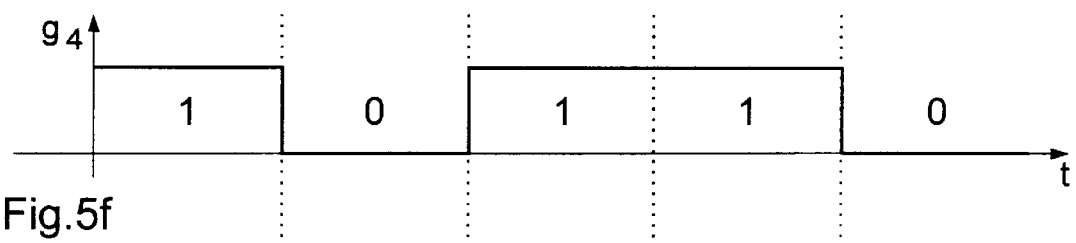
Figure 5G:
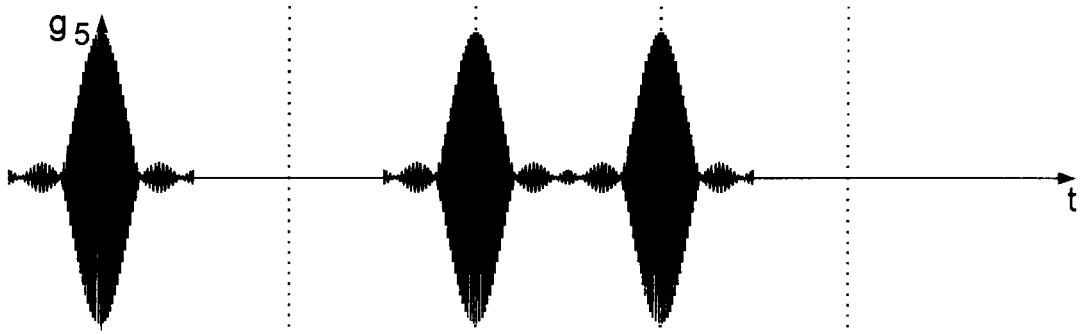
Figure 5H:
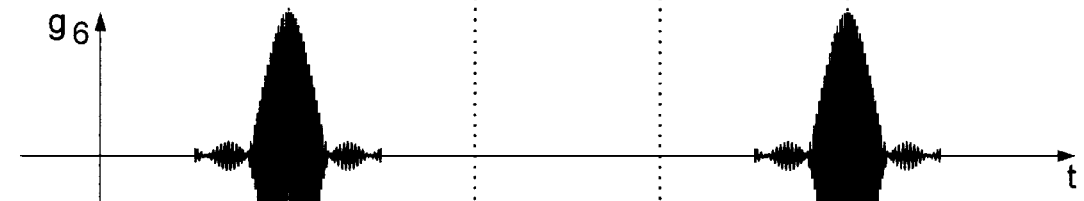
Figure 5I:
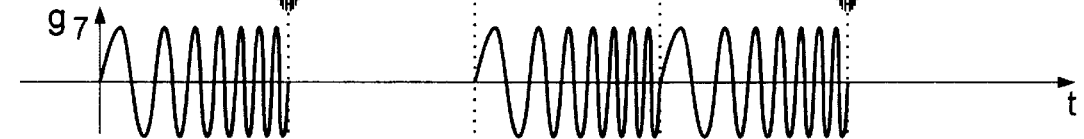
Figure 5J:
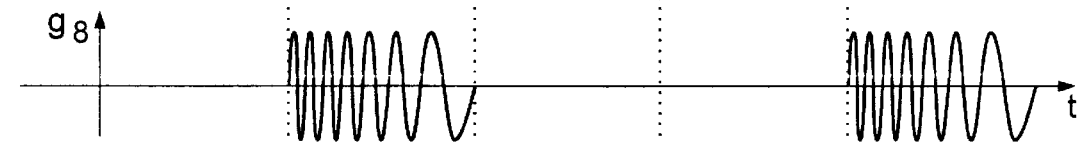

The transmitter shown in FIG. 4a contains a pulse shaper 17, which is triggered by a timing generator 16, using timing pulses opposite in phase, shown in FIGS. 5a, 5b. At its output the pulse shaper emits—as shown in FIG. 5c—a sequence $g_1$ of needle shaped pulses that form a (quasi-) Dirac delta sequence. The pulse sequence $g_1$ generated in this manner is subsequently fed to a low-pass filter 18, the filter characteristic of which possesses a peak just before the critical frequency, and that transforms the needle shaped pulses to Sinc-shaped pulses, which are shown in detail in FIG. 5d. Subsequently, this pulse sequence $g_2$ is modulated onto a carrier oscillation with carrier frequency $f_T$, generated by the oscillator 19, using an amplitude modulator 20. Thus, at the output of amplitude modulator 20 arrives a sequence $g_1$ of equidistant carrier frequency pulses with Sinc-shaped envelopes. It is important in this context, that the pulse sequence $g_3$ arriving at the output of the amplitude modulator 20 is independent of the digital input signal $g_4$, and thus does not contain any information.

Subsequently, the imprinting of the information of input signal $g_4$ is effected by means of an analogue switch 21, which is controlled by input signal $g_4$, and, depending on the amplitude of the input signal $g_4$, directs the pulse sequence $g_3$, generated by amplitude modulator 20, either to a dispersion filter 22 with a frequency dependent linearly decreasing delay time, or to a dispersion filter 23 with a frequency dependent linearly rising delay time. At their outputs, the dispersion filters 22, 23 are connected to a further analogue switch 24 or a mixer stage, which, depending on the amplitude of input signal $g_4$, selects the output signal $g_7$, $g_8$ of one of the two dispersion filters 22, 23 and passes it on.

Figure 5K:
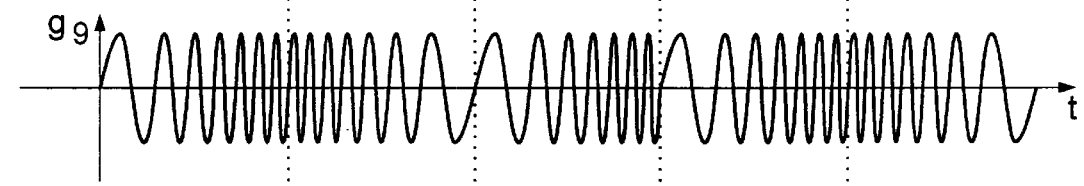

Thus, at the output of the analogue switch 24 arrives—as shown in FIG. 5k—a sequence $g_9$ of carrier frequency pulses, linearly frequency modulated pulse by pulse, whereby for a high level of the input signal $g_4$ the individual pulses show a linearly increasing frequency during the pulse duration, whereas for a low level of input signal $g_4$ the frequency during the pulse decreases linearly.

The signal arriving at the output of analogue switch 24 is subsequently filtered by a band-pass filter to suppress interference signals located outside of the transmission band. The signal obtained in this manner is then amplified by a transmitter amplifier 26 and is emitted by the transmitter antenna 27.

FIG. 4b shows the associated receiver that receives the signal, emitted by the transmitter shown in FIG. 4a, using an antenna 28. The receiver amplifies the signal in a preamplifier 29, and in a band-pass filter 30 removes any interference signals, the frequency of which lies outside the transmission band.

Subsequently, tie received signal is carried to two dispersion filters 32, 33 by a switching element 31. Hereby the frequency dependent delay time response of the two dispersion filters 32, 33 on the receiver side is matched in pair to the frequency dependent delay time response of the two dispersion filters 22, 23 on the transmitter side, in such a way that the spectral signal components of the received signal add to a pulse with increased amplitude at the output of one of the two dispersion filters, 32 or 33, while only a time expanded pulse arrives at the output of the other dispersion filter, 33 or 32.

Figure 6A:
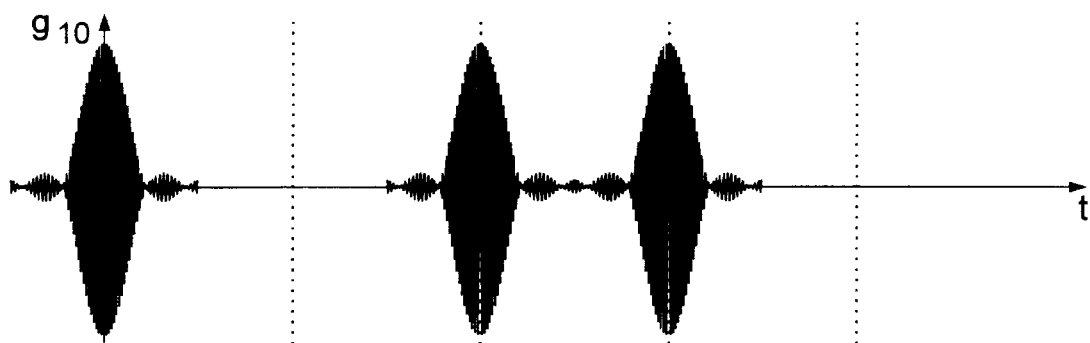
FIGS. 6a to 6e show the signal picked up on the receiver side, as well as several intermediary stages of the signal processing in the receiver.
Figure 6B:
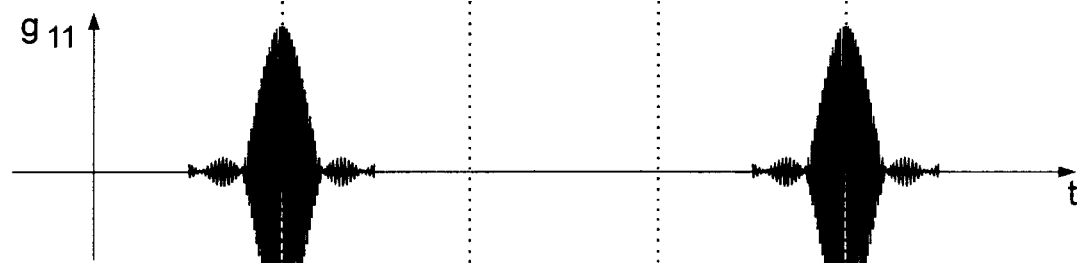

As seen in FIGS. 6a and 6b, the output signals $g_{10}$ or $g_{11}$ of dispersion filters 32, 33 consist of a sequence of carrier frequency pulses with Sinc-shaped envelopes.

Figure 6C:
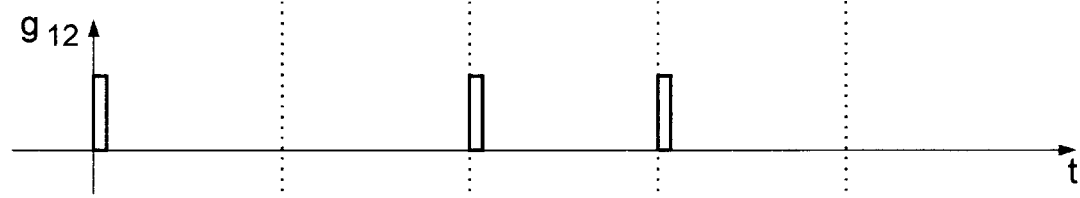
Figure 6D:
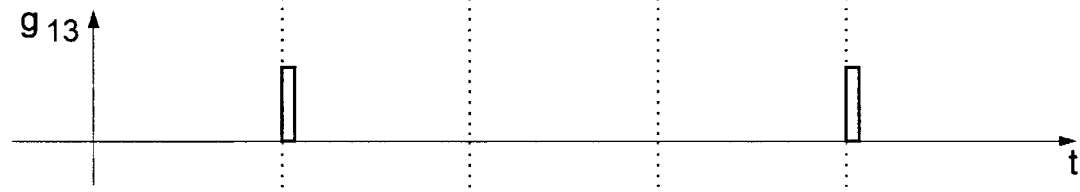

The signals $g_{10}$ or $g_{11}$, appearing at the output of the two dispersion filters 32, 33, are subsequently fed to a demodulator 34, 35, which separates the signals $g_{10}$ or $g_{11}$ from the carrier oscillation and generates needle shaped pulses, as; seen in FIGS. 6c or 6d.

While each of the needle impulses at the output of demodulator 34 corresponds to one high level of the input signal $g_4$, the needle impulses arriving at the output of the other demodulator 35 indicate low levels of input signal $g_4$.

Figure 6E:
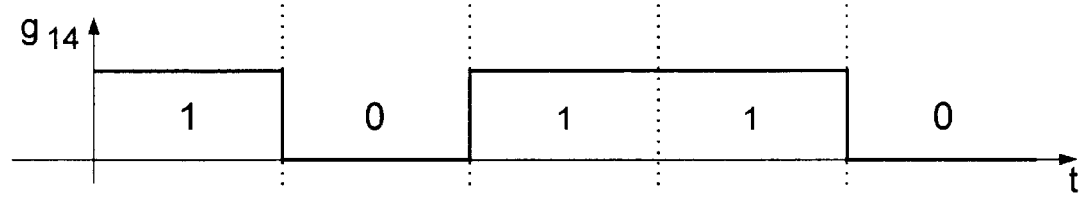

To recover the original input signal $g_4$ from the two signals $g_{12}$, $g_{13}$, the two signals $g_{12}$, $g_{13}$ are fed to a timing generator 36 for triggering, which generates a timing signal that reproduces the timing rate of the original input signal $g_4$. This timing signal, together with the output signals $g_{12}$, $g_{13}$ of the two demodulators 34, 35 is fed to the decoder 37, which recovers the original output signals, $g_4$, $g_{14}$, as can bee seen in FIG. 6e.

Figure 7:
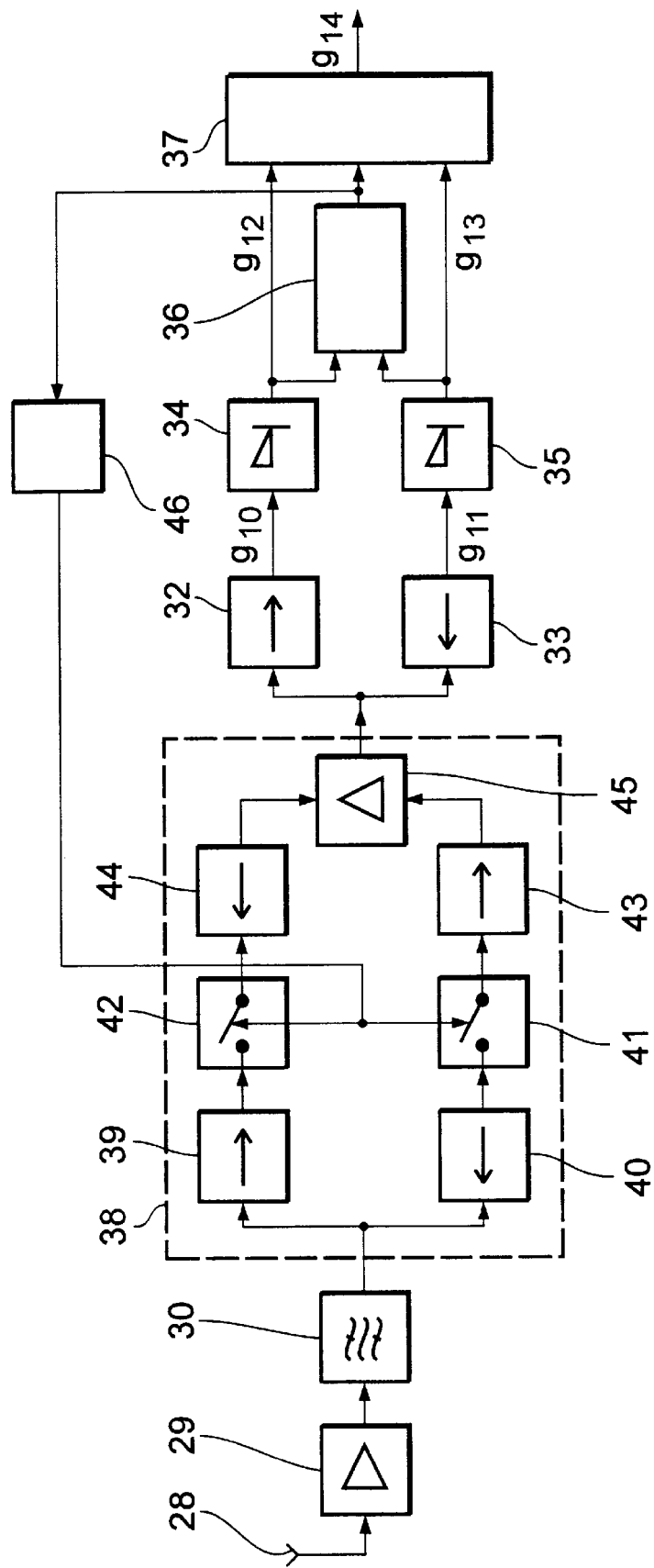
FIGS. 7, 8 each show a modified form of the receiver shown in FIG. 4b with a noise suppression circuit.

FIG. 7 shows a modified form of the receiver shown in FIG. 4b, with a noise suppression circuit 38, which can be combined with other receivers for such Chirp signals. Due to the very close similarity of this receiver with the one shown in FIG. 4b, functionally equivalent components are labeled by the same reference signs in the two figures.

As in the previously described receiver, the signal chirped on the transmitter side is received through an antenna 28 and at first fed to an input amplifier 15 and a band-pass filter 30, which is tuned to the carrier frequency and thus filters out noise signals lying outside the transmission band. Subsequently, the signal is carried to the noise suppression circuit 38 and split into two parallel branches, in each of which two dispersion filters 39, 44 or 40, 43, inverse with respect to each other, are connected in series. During an active transmission of a logic LOW level as well as of a logic HIGH level, one of the two dispersion filters, 39 or 40, arranged on the input side, is tuned in such a way that a time compressed signal arrives al: the output of this dispersion filter, 39 or 40. At the output of the other dispersion filter, 39 or 40, arrives a pulse that is time expanded to twice its original length. The two analogue switches 41, 42 interrupt the signal flow in the two branches symmetrically around the center of the compressed pulse, so that the time compressed pulse is suppressed and only the time expanded pulse in the other branch remains. Hereby the analogue switches 41, 42 are controlled through the synchronizing circuit 46, that is triggered by the timing generator 36, and thus reproduces the timing of the output signal, and thus the transmission timing. The following dispersion filters 43, 44 generate the original pulse, with original width and correspondingly also with original amplitude, from the time expanded pulse. These pulses are then fed to the subtracter 45, at the output of which appears essentially the original pulse.

The matter is different for the noise that is caused by the noisy transmission path, and is received by the receiver together with the useful signal. This noise is at first shifted into different directions by the dispersion filters 39, 40. But the dispersion filter 43, 44, connected after, reverse this shift, so that the input noise is reconstructed in the two branches, except the very short portion cut out by the analogue switches 41, 42. Thus the subtraction by the subtracter 45 leads to extensive suppression of thee noise picked up on the receiver side.

The further processing of the signal that was prepared in this manner then occurs as described in the description to FIG. 4b.

Figure 8:
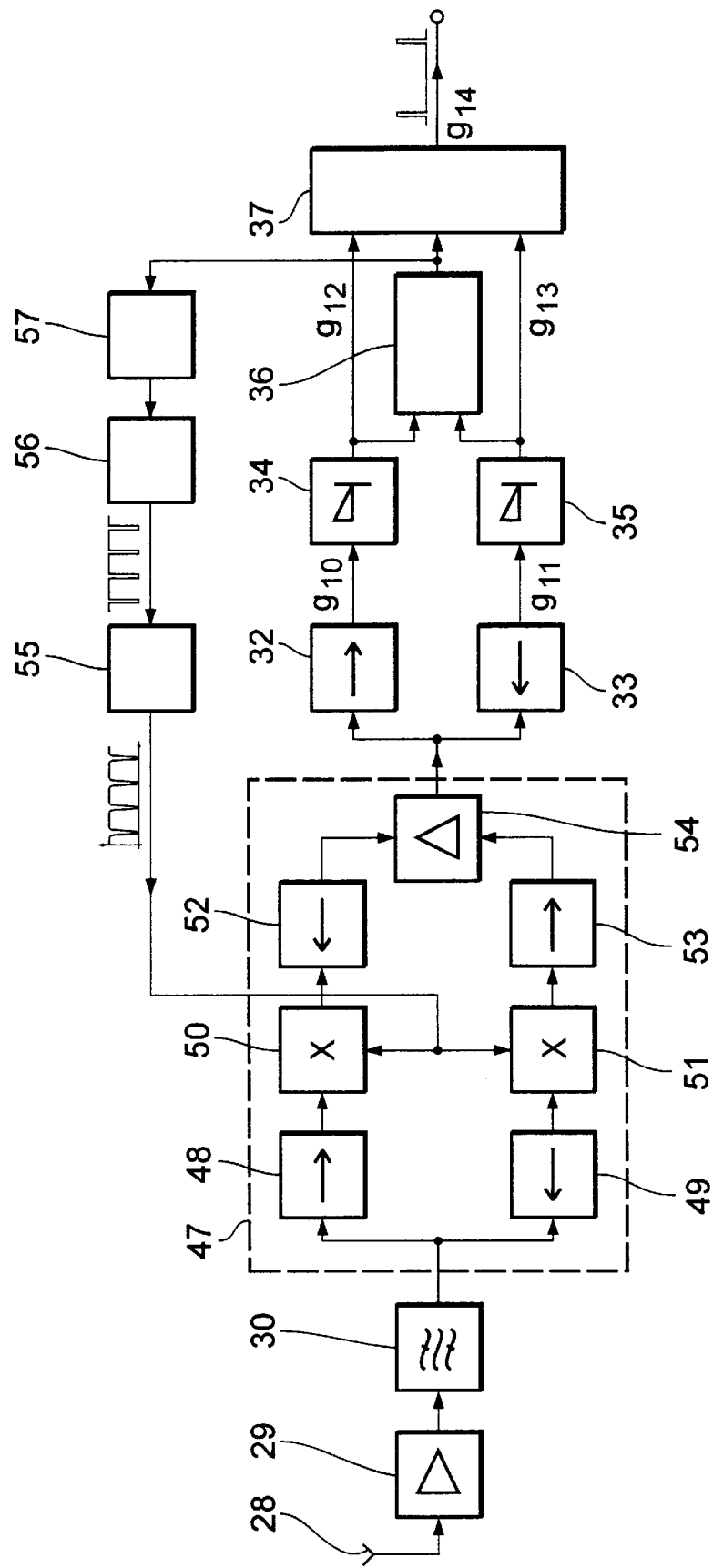

The receiver shown in FIG. 8 differs from the one described above and illustrated in FIG. 7 essentially by the design and the controlling of the noise suppression circuit 47. Due to the extensive similarity of the two circuits, functionally equivalent components or component modules are labeled by identical reference signs in FIGS. 7 and 8.

As with the receiver shown in FIG. 7, the chirped pulses are received by the antenna 28 and at first fed to an input amplifier 29 and a band-pass filter 30, which is tuned to the carrier frequency and thus filters out noise signals lying outside the transmission band.

Subsequently the signal is carried to the noise suppression circuit 47, which splits the signal into two parallel branches, that each contain two dispersion filters 48, 52 and 49, 53, inverse with respect to each other, connected in series. At the output of the noise suppression circuit 47 the two branches are joined by the subtracter 54, whereby the noise in the received signal is completely suppressed by the subtraction.

In contrast, the chirped signal is not cancelled by the subtraction in the subtracter 54, so that the signal/noise ratio is significantly increased. Hereby the dispersion filters 48, 49 on the input side are matched to the chirped signals, generated on the transmitter side, in such a way that a time compressed pulse with correspondingly increased amplitude appears at the output of one of the dispersion filters 48, 49, whereas a time expanded pulse with correspondingly reduced amplitude appears at the output of the other dispersion filter 49, 48. Upon arrival of the compressed pulses, the signal flow in the two branches is suppressed synchronously by the multipliers 50, 51,—as will be described in detail—so that the compressed pulse is suppressed and there remains only the time compressed pulse excluding the negligible short cut-out. The original pulse is then generated from the time expanded pulse by the dispersion filters 52, 53 connected after, so that essentially the originally received signal, with a significantly improved signal to noise ratio, arrives at the output of the subtracter 54.

The triggering of the multipliers 50, 51 occurs in fixed synchronization with the transmission timing rate, so that the signal in the two branches of the noise suppression circuit 47 can be suppressed exactly at the arrival of the time compressed pulse. For this, the receiver contains a synchronizing circuit 57, which on the input side is connected to the timing generator 36 for synchronization. Subsequently, Sinc-pulses with amplitude 1, lying inverted with the peak towards to zero, are generated by a pulse shaper 56 and a low-pass filter 55, and are then fed to the multipliers 50, 51. The multipliers 50, 51 multiply the signals in the two branches of the noise suppression circuit 47, either by zero or by unity, which accordingly either suppresses the signal or leaves the signal to pass essentially unchanged. Thus the multipliers 50, 51 here have the same effect as the switching elements 41, 42 in the variation of the noise suppression circuit 38 described before.

The scope of the invention is not limited to the previously listed preferred embodiments. A multitude of variations is possible that make use of the presented solution even in fundamentally different implementations. The embodiment examples shown here should only be seen as basic types of a wide spectrum of solutions.

Figure 9A:
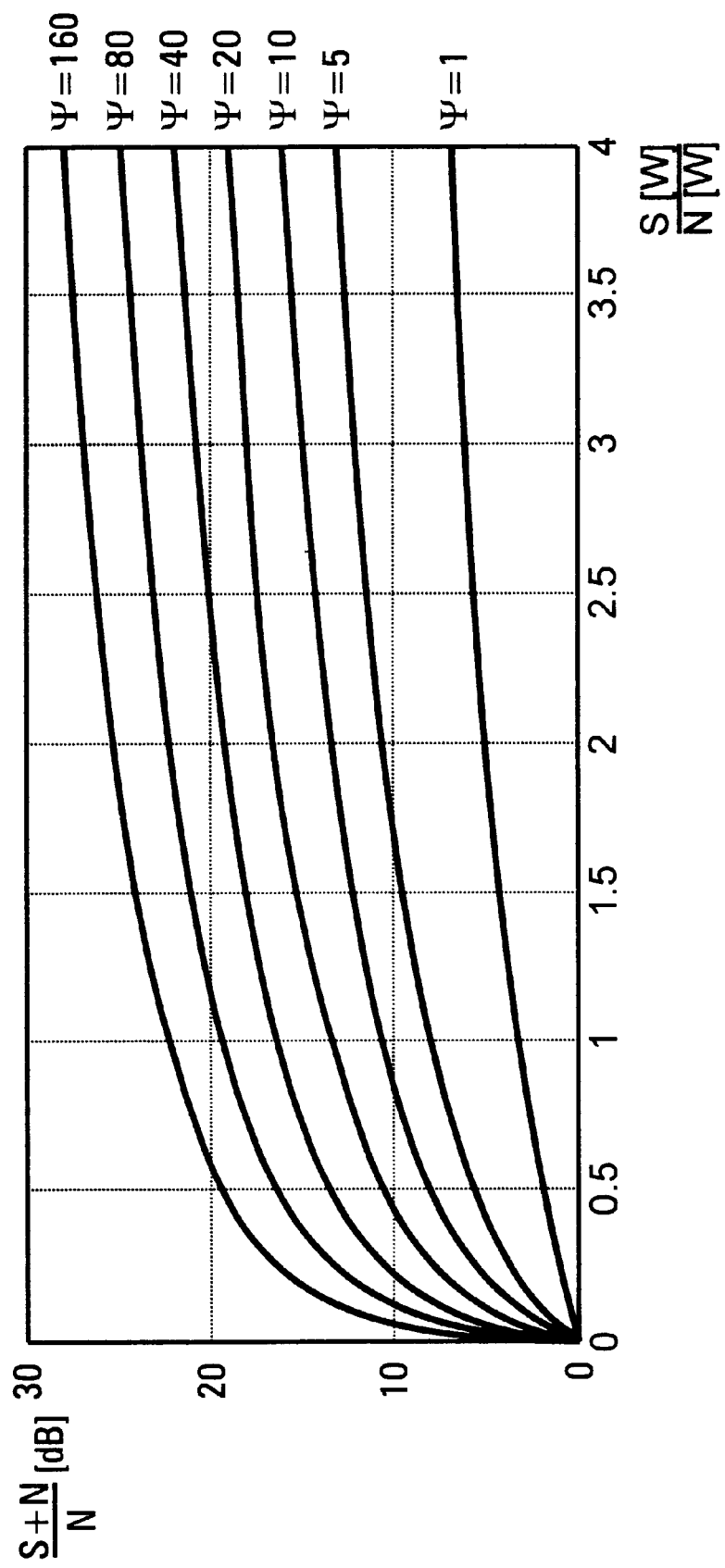
FIGS. 9a and 9b show graphical illustrations of the improvement in the signal/noise ratio obtainable with this invention's method.
Figure 9B:
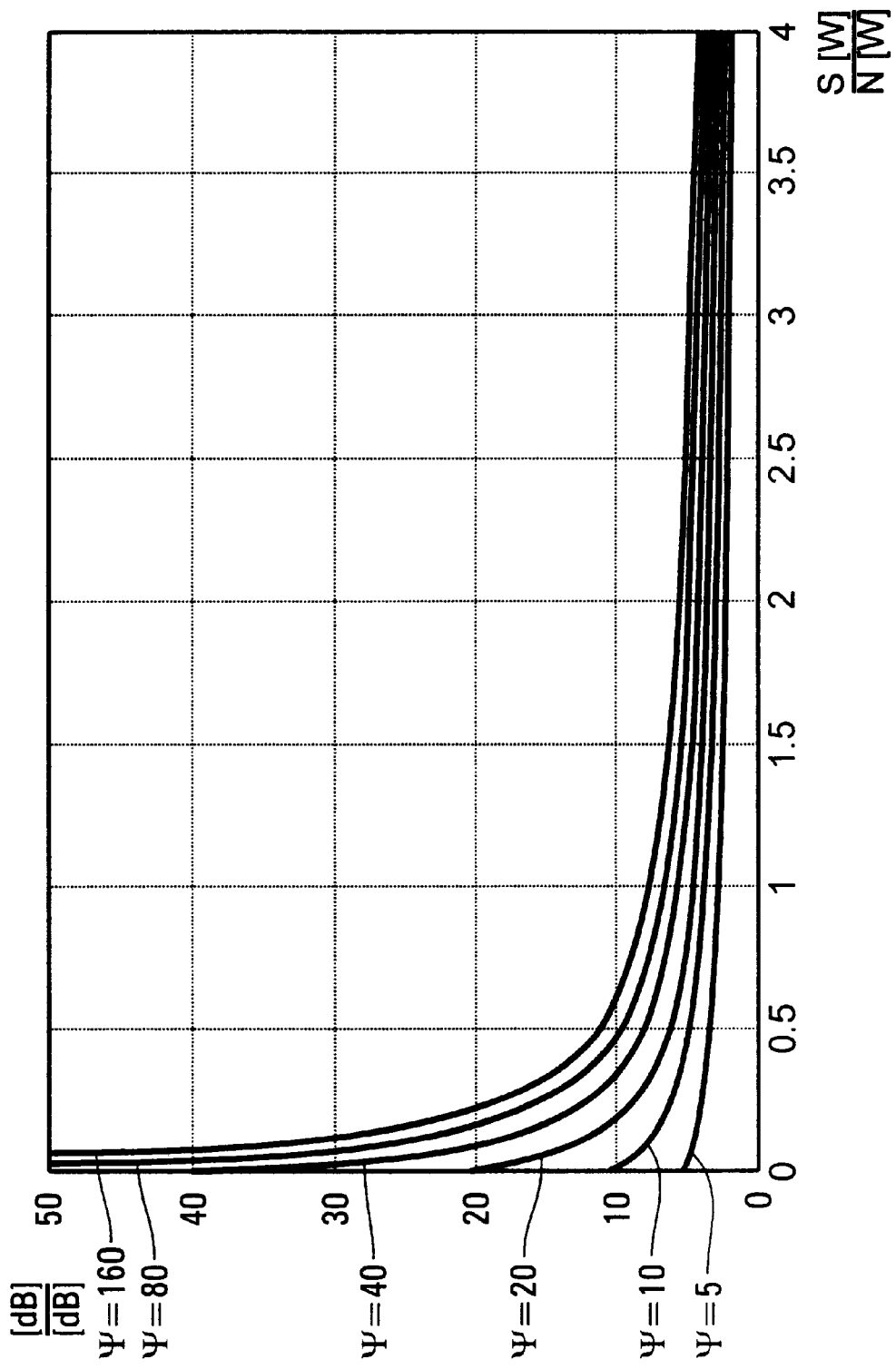

FIGS. 9a and 9b illustrate the improvement of the signal/noise ratio that can be achieved by this invention for different expansion factors $\iota=T_T/\delta$, with $T_T$ as mean duration of a transmission pulse processed using the "Chirp" technique, and $\delta$ as the mean duration of the pulse compressed in the receiver. FIG. 9a shows the signal to noise ratio (S+N)/N at the receiver output as a function of S/N at the receiver input, and FIG. 9b shows the dependence of the relation (S+N)/N=f(S/N) normalized to $\iota=1$—i.e. the degree of improvement as a function of the original signal/noise ratio. Hereby, values in the range from 1 to 160 are selected as parameter for $\iota$.

The figures illustrate that the improvement that can be achieved becomes larger with increasing pulse "expansion"/compression, and is especially distinct for small original signal/noise ratios. This clearly documents that the method can be utilized advantageously in particular in strongly interfering surroundings, and/or for long transmission ranges, and/or for low transmitting power.

What is claimed is:

1. Method for wireless transmission of a digital signal, particularly for mobile communication, from a sender with antenna to a receiver with antenna, in which the signal is modulated in the sender and reaches the receiver via a transmission channel, characterized in that, in the sender, the digital signal is first converted into a quasi Dirac pulse sequence, wherein the frequency band of the quasi Dirac pulse sequence is limited by a low-pass filter such that the quasi Dirac pulse sequence is converted into a sequence of gap pulses whose form is described by the si function $si(x)=^{sinx}/_x$, which is subsequently modulated to a carrier frequency and then supplied to a dispersive filter for expansion, so that on the output side a frequency-modulated pulse sequence is output, wherein a transmitting pulse is time-compressed on the receiving side such that a pulse is created which has a shorter duration and increased amplitude compared to the transmitted pulses.

2. Method of claim 1 whereby the pulses are filtered according to a default filter characteristic, whereby the angle modulation on the transmitter side and the group delay response of the dispersion filter on the receiver side are matched in such a way that the signal components of the angle modulated pulses of an output signal arrive at the output of the dispersion filter, due to the filter's frequency dependent variable signal delay time, essentially coincident and, due to the superposition, with increases amplitude compared to the input.

3. Method of claim 1 whereby an input signal possesses a carrier frequency, which is subjected pulse by pulse to an angle modulation in the transmitter.

4. Method of claim 1 whereby the additional modulation method that imprints the information is, in particular, a pulse position modulation (PPM), or optionally a pulse code modulation (PCM), or a differential pulse code modulation (DPCM), or a pulse delta modulation (PDM), or a modification of one or several of these modulation methods.

5. Method of one of claim 2 whereby the pulse sequence, angle modulated in the transmitter, is fed to a pair of dispersion filters in the receiver, whereby the pair of dispersion filters in the receiver possess different group delay responses which are matched in pairs to the modulation characteristic in such a way, that the signal components of the pulses arrive with increased amplitude at the output of only one of the pair of dispersion filters, while such an increase in amplitude does not take place for the other of the pair of dispersion filters, and the amplitudes are evaluated comparatively at the output of the pair of dispersion filters using a detector.

6. Method of claim 5 whereby the angle—the frequency or the phase—of the carrier frequency changes, during the pulse duration of the pulse modulated signals, linearly with time, monotonically from a lower frequency or phase position to an upper frequency or phase position, or in reverse direction, and the dispersion filter in the receiver possesses a complementary linear response.

7. Method of claim 1 whereby
the modulation characteristics for the individual pulses of a series of pulses are selected differently in such a way that the differences contain part of the information.

8. Method of claim 1 whereby,
for matching of transmitter and receiver, a default digital reference signal is transmitted as input signal as alignment during the matching process,
during the matching process the amplitude or the pulse duration of the output signal of the dispersion filter on the receiver side is measured, and the modulation characteristic used on the transmitter side, or the group delay response of the dispersion filter on the receiver side, is varied, until the pulse duration reaches a minimum value, or the amplitude reaches a maximum value.

9. Sender-receiver arrangement comprising a sender for receiving and transmitting an input signal, wherein the sender has means for modulating the digital signal, and on the sender side, means for first converting the digital signal into a quasi Dirac pulse sequence, wherein a low pass filter on the sender side limits the frequency band of the quasi Dirac pulse sequence such that the quasi Dirac pulse sequence is converted into a sequence of gap pulses whose form is described by the si function $si(x) = \sin x / x$, which is modulated to a carrier frequency by means of a corresponding modulator and is supplied to a dispersive filter on the sender side for expansion, so that the sender outputs a frequency-modulated pulse sequence on the output side, and, in the receiver, the pulse sequence is time-compressible by means of a filter with frequency-dependent differential propagation time, also referred to as group delay time, such that pulses are created which have a shorter duration and increased amplitude compared to the transmitting, frequency-modulated pulses.

10. Arrangement of claim 9 whereby
the first modulator generates a series of angle modulated pulses, whereby the angle modulation is carried out depending on the input signal at the control input, either according to a default first modulation characteristic or according to a second default modulation characteristic,
the receiver contains two dispersion filters connected in parallel, whereby the variable group delay response of the two dispersion filters and the first and second modulation characteristics are matched in such a way that the signal components of the angle modulated pulse sequence arrive time compressed and with increased amplitude at the output of exactly one of the two dispersion filters.

11. Arrangement of claim 9 whereby
the first modulator generates angle modulated pulses, whereby the angle modulation occurs independent of the input signal according to a default modulation characteristic, which determines the time variation of the frequency during the duration of each pulse, the second modulator on the transmitter side, for imprinting the information contained in the input signal, is an amplitude modulator, which determines the amplitude of the angle modulated pulses depending on the input signal,
the receiver for filtering of the pulses, angle modulated on the transmitter side according to the default modulation characteristic, contains exactly one dispersion filter with a default group delay response that is matched to the modulation characteristic used on the transmitter side in such a way that the signal components of each angle modulated pulse arrive time compressed and with increase in amplitude at the output of the dispersion filter on the transmitter side, and
a detector is connected after the dispersion filter on the transmitter side for recovery of the information contained in the input signal.

12. Arrangement of claim 9 whereby,
to allow alternating transmitting and receiving operation, the transmitter and the receiver contain corresponding, essentially identical component modules for modulation or demodulation, each containing at least one dispersion filter.

13. Method for wireless transfer of information, in particular for mobile communications, wherein an input signal is subjected to an angle modulation in a transmitter and reaches a receiver through a transmission channel, whereby
angle modulated pulses, possessing a frequency spectrum and carrying information, are generated in the transmitter in such a way, that they are time compressed in the receiver using a dispersion filter in the receiver with frequency dependent, differential delay time, also referred to as group delay, in such a way that pulses are created with shortened duration and increased amplitude, compared to the emitted pulses, and
at least a portion of the information in the transmitter is imprinted onto the pulses using an additional modulation, independent of the angle modulation, and/or is used for controlling a parameter of the angle modulation in the receiver, and
the modulation characteristic of the angle modulation determines the time variation of the phase angle during the duration of each pulse,
the amplitude of the angle modulated pulses in particular is used for the imprinting of the information contained in the input signal, depending on the input signal,
the group delay response of the dispersion filter in the receiver is complementary to the frequency-time characteristic of the transmission pulse, and
the amplitude of the pulse arriving compressed from the dispersion filter in the receiver is evaluated for recovery of the information contained in the input signal using a detector, in particular an amplitude demodulator,
the pulse sequence, angle modulated in the transmitter, is fed to a pair of dispersion filters in the receiver, whereby the pair of dispersion filters in the receiver possess different group delay responses which are matched in pairs to the modulation characteristic in such a way, that the signal components of the pulses arrive with increased amplitude at the output of only one of the dispersion filters in the receiver, while such an increase in amplitude does not take place for the other one of the dispersion filters in the receiver, and the amplitudes are evaluated comparatively at the output of the dispersion filters in the receiver using a detector, and whereby
the signal flow in the receiver is split into two parallel branches, each with two additional pairs of dispersion filters with group delay characteristics that are inverse with respect to each other, the signal flow in the two branches is connected through or interrupted for a predetermined time interval during each pulse, whereby the interruption or connection occurs synchronous with the transmission timing rate,
the two branches are joined on the output side by a subtracter.

14. Transmitter and receiver arrangement comprising
a transmitter, for pick-up and transmission of an input signal, whereby the transmitter contains a first modulator for angle modulation of the input signal, as well as a receiver, containing a demodulator for recovery of the input signal, whereby the first modulator generates angle modulated pulses according to a modulation characteristic that determines the time variation of the angle or phase position during the duration of each pulse,
the first modulator contains a control input for the pick-up of the input signal and for the setting of the modulation characteristic depending on the input signal, and/or the transmitter contains a second modulator for an additional modulation of the angle modulated pulses depending on the input signal,
the receiver contains a dispersion filter, in particular a surface acoustic wave filter, with a default group delay response for filtering the pulses, angle modulated on the transmitter side, according to the default modulation characteristic,
the group delay response of the dispersion filter in the receiver is matched, for an increase in amplitude of the output signal, to the modulation characteristic used on the transmitter side in such a way that the signal components of the pulses, angle modulated according to this modulation characteristic, arrive time compressed and with an amplitude enhancement at the output of the dispersion filter, due to the filter's frequency dependent, variable signal delay time, and whereby
 the receiver contains a noise suppression circuit, essentially consisting of two parallel branches, which are connected on the output side to the inputs of a subtracter, and in each of which two dispersion filters with group delay characteristics, inverse with respect to each other, are series connected, whereby in each of the two branches, between the two dispersion filters, a control element for controlling the signal flow is placed, which is connected to a synchronizing circuit for synchronization of the signal flow control with the transmission timing rate.

15. Transmitter and receiver arrangement comprising
a transmitter, for pick-up and transmission of an input signal, whereby the transmitter contains a first modulator for angle modulation of the input signal, as well as a receiver, containing a demodulator for recovery of the input signal, whereby
the first modulator generates angle modulated pulses according to a modulation characteristic that determines the time variation of the angle or phase position during the duration of each pulse,
the first modulator contains a control input for the pick-up of the input signal and for the setting of the modulation characteristic depending on the input signal, and/or the transmitter contains a second modulator for an additional modulation of the angle modulated pulses depending on the input signal,
the receiver contains a dispersion filter, in particular a surface acoustic wave filter, with a default group delay response for filtering the pulses, angle modulated on the transmitter side, according to the default modulation characteristic,
the group delay response of the dispersion filter in the receiver is matched, for an increase in amplitude of the output signal, to the modulation characteristic used on the transmitter side in such a way that the signal components of the pulses, angle modulated according to this modulation characteristic, arrive time compressed and with an amplitude enhancement at the output of the dispersion filter in the receiver, due to the filter's frequency dependent, variable signal delay time,
the receiver contains a noise suppression circuit, essentially consisting of two parallel branches, which are connected on the output side to the inputs of a subtracter, and in each of which two dispersion filters with group delay characteristics, inverse with respect to each other, are series connected, whereby in each of the two branches, between the two dispersion filters in the noise suppression circuit, a control element for controlling the signal flow is placed, which is connected to a synchronizing circuit for synchronization of the signal flow control with the transmission timing rate, and whereby
 the control element is a multiplier that, on the input side, is connected to the dispersion filter, connected before, and, for timed interruption or disconnection of the signal flow, with the synchronizing circuit.

* * * * *